(12) United States Patent
Hong et al.

(10) Patent No.: US 8,343,281 B2
(45) Date of Patent: Jan. 1, 2013

(54) SOURCE GAS SUPPLY UNIT, AND DEPOSITION APPARATUS AND METHOD USING THE SAME

(75) Inventors: Jong-Won Hong, Yongin (KR); Min-Jae Jeong, Yongin (KR); Heung-Yeol Na, Yongin (KR); Eu-Gene Kang, Yongin (KR); Seok-Rak Chang, Yongin (KR)

(73) Assignee: Samsung Display Co., Ltd., Yongin (KP)

( * ) Notice: Subject to any disclaimer, the term of this patent is extended or adjusted under 35 U.S.C. 154(b) by 288 days.

(21) Appl. No.: 12/711,495

(22) Filed: Feb. 24, 2010

(65) Prior Publication Data

US 2011/0070360 A1 Mar. 24, 2011

(30) Foreign Application Priority Data

Sep. 22, 2009 (KR) .................. 10-2009-0089698

(51) Int. Cl.
*C23C 16/00* (2006.01)
*C23C 16/52* (2006.01)
*C23C 16/448* (2006.01)
(52) U.S. Cl. ....................... 118/726; 118/715
(58) Field of Classification Search .......... 118/726, 118/715
See application file for complete search history.

(56) References Cited

U.S. PATENT DOCUMENTS

| | | | | |
|---|---|---|---|---|
| 4,220,460 A * | 9/1980 | Partus | ................ | 65/530 |
| 4,276,243 A * | 6/1981 | Partus | ................ | 261/128 |
| 4,468,283 A * | 8/1984 | Ahmed | ................ | 117/102 |
| 4,582,480 A * | 4/1986 | Lynch et al. | ................ | 432/1 |
| 4,844,006 A * | 7/1989 | Page et al. | ................ | 118/719 |
| 4,856,457 A * | 8/1989 | Knauer | ................ | 118/666 |
| 5,160,542 A * | 11/1992 | Mihira et al. | ................ | 118/715 |
| 5,186,120 A * | 2/1993 | Ohnishi et al. | ................ | 118/667 |
| 5,203,925 A * | 4/1993 | Shibuya et al. | ................ | 118/724 |
| 5,372,754 A * | 12/1994 | Ono | ................ | 261/142 |
| 5,451,258 A * | 9/1995 | Hillman et al. | ................ | 118/715 |
| 6,086,711 A * | 7/2000 | Kanishak et al. | ................ | 156/345.29 |
| 6,165,275 A * | 12/2000 | Kamei | ................ | 118/725 |
| 6,596,085 B1 * | 7/2003 | Schmitt et al. | ................ | 118/726 |
| 6,663,716 B2 | 12/2003 | Loan et al. | | |
| 6,808,567 B2 * | 10/2004 | Takeshita et al. | ................ | 118/715 |
| 6,868,869 B2 * | 3/2005 | Olander | ................ | 137/888 |
| 6,983,214 B2 * | 1/2006 | Hiraizumi et al. | ................ | 702/100 |
| 7,141,095 B2 * | 11/2006 | Aitchison et al. | ................ | 95/273 |

(Continued)

FOREIGN PATENT DOCUMENTS

JP 04-318174 9/1992

(Continued)

*Primary Examiner* — Jeffrie R Lund
(74) *Attorney, Agent, or Firm* — H.C. Park & Associates, PLC

(57) ABSTRACT

Provided are a source gas supply unit capable of supplying a constant amount of source gas to a deposition chamber to deposit a uniform layer, and a deposition apparatus and method using the same. The source gas supply unit includes a canister in which a source is stored, a heater heating the canister, a source gas supply pipe provided on one side of the canister, a measuring unit installed on the source gas supply pipe and measuring an amount of source gas passing through the source gas supply pipe, and a temperature controller connected to the heater and the measuring unit. The temperature controller controls the heater based on the amount of the source gas measured by the measuring unit.

25 Claims, 2 Drawing Sheets

U.S. PATENT DOCUMENTS

| | | |
|---|---|---|
| 7,629,590 B2 * | 12/2009 | Horsky et al. ............ 250/423 R |
| 7,651,570 B2 * | 1/2010 | Brcka ........................ 118/726 |
| 8,137,462 B2 * | 3/2012 | Fondurulia et al. ......... 118/715 |
| 2003/0046941 A1 * | 3/2003 | Pant et al. ..................... 62/49.1 |
| 2005/0072357 A1 * | 4/2005 | Shero et al. ................. 118/715 |
| 2005/0098906 A1 * | 5/2005 | Satoh et al. ..................... 261/19 |
| 2005/0115505 A1 * | 6/2005 | Sandhu ........................ 118/726 |
| 2005/0131532 A1 * | 6/2005 | Sirhan et al. ................ 623/1.42 |
| 2005/0181129 A1 * | 8/2005 | Olander ...................... 427/248.1 |
| 2006/0185597 A1 * | 8/2006 | Suzuki et al. ............... 118/726 |
| 2006/0272775 A1 * | 12/2006 | Horsky et al. ........... 156/345.37 |
| 2006/0272776 A1 * | 12/2006 | Horsky et al. ........... 156/345.37 |
| 2007/0108395 A1 * | 5/2007 | Horsky et al. ............... 250/489 |
| 2007/0210260 A1 * | 9/2007 | Horsky et al. ............... 250/424 |
| 2008/0085226 A1 * | 4/2008 | Fondurulia et al. ......... 422/198 |
| 2008/0202426 A1 * | 8/2008 | Suzuki ........................ 118/726 |
| 2009/0056757 A1 * | 3/2009 | Son et al. ........................ 134/18 |
| 2009/0151631 A1 * | 6/2009 | Minamida et al. ......... 118/663 |
| 2009/0304906 A1 * | 12/2009 | Suduo et al. ..................... 427/8 |
| 2010/0092665 A1 * | 4/2010 | Sudou ....................... 427/248.1 |
| 2011/0008540 A1 * | 1/2011 | Na et al. .................. 427/255.23 |
| 2011/0070360 A1 * | 3/2011 | Hong et al. ...................... 427/8 |
| 2011/0091650 A1 * | 4/2011 | Noguchi et al. ......... 427/255.28 |

FOREIGN PATENT DOCUMENTS

| | | |
|---|---|---|
| JP | 07-118862 | 9/1995 |
| KR | 10-2001-0034781 | 1/2001 |
| KR | 10-2003-0085824 | 11/2003 |
| KR | 10-2004-0099578 | 12/2004 |
| KR | 10-2007-0069646 | 7/2007 |
| WO | WO 01/29282 | 4/2001 |

\* cited by examiner

SOURCE GAS SUPPLY UNIT, AND DEPOSITION APPARATUS AND METHOD USING THE SAME

CROSS-REFERENCE TO RELATED APPLICATION

This application claims the benefit of Korean Application No. 10-2009-0089698, filed Sep. 22, 2009 in the Korean Intellectual Property Office, the disclosure of which is incorporated herein by reference.

BACKGROUND

1. Field

Aspects of the present invention relate to a source gas supply unit, and a deposition apparatus and method using the same, and more particularly, to a source gas supply unit capable of supplying a constant amount of source gas, and a deposition apparatus and method capable of uniformly depositing a layer using the same.

2. Description of the Related Art

With the rapid development of electronic display industries, thin, light-weight flat panel displays (FPDs) have recently been used in place of a cathode ray tube (CRT). Examples of FPDs include a liquid crystal display (LCD), a plasma display panel (PDP), and an organic light emitting diode (OLED) display device. FPDs have mainly used as a display device for a television (TV), a computer monitor, or the like.

The OLED display device is a spontaneous light-emitting display device that electrically excites fluorescent organic compounds to emit light. The OLED display device displays an arbitrary image on a panel by forming an organic compound layer between a positive electrode (anode) and a negative electrode (cathode), injecting electrons and holes from the outside, and emitting light by the energy of electron-hole recombination.

The OLED display device includes an anode, an organic layer, and a cathode, which are stacked on a substrate, and may further include at least thin film transistor (TFT). The organic layer includes an organic emission layer. In this organic emission layer, the holes and the electrons are recombined to form excitons, and generate light. Here, to further increase luminous efficiency, the holes and electrons should be more smoothly transported to the organic emission layer.

To this end, an electron transport layer may be interposed between the cathode and the organic emission layer, and a hole transport layer may be interposed between the anode and the organic emission layer. Further, a hole injection layer may be interposed between the anode and the hole transport layer, and an electron injection layer may be interposed between the cathode and the electron transport layer.

As described above, the OLED display device is formed by stacking a plurality of layers, such as a conductive layer, an organic layer, and an insulating layer. As a typical method of forming a thin film on a substrate, physical vapor depositions (PVDs) are used. PVDs include methods such as evaporation, ion plating and sputtering, chemical vapor depositions (CVDs) based on gas reaction, etc.

The formation of the thin film using a conventional CVD is carried out by introducing a carrier gas into a canister in which a source for forming the thin film is stored, evaporating the source, supplying a mixed gas of the carrier gas and the evaporated source gas into a deposition chamber, and depositing the source on a substrate disposed in the deposition chamber. However, in the case of the CVD, the shape or capacity of the source is changed due to the introduction of the carrier gas. Thus, it is difficult to stably evaporate the source, and the source is therefore non-uniformly deposited on the substrate.

SUMMARY

Aspects of the present invention provide a source gas supply unit capable of supplying a constant amount of source gas to a deposition chamber.

Aspects of the present invention also provide a deposition apparatus and method capable of uniformly depositing a layer using the source gas supply unit.

According to an exemplary embodiment of the present invention, a source gas supply unit includes a canister in which a source is stored, a heater heating the canister, a source gas supply pipe provided on one side of the canister, a measuring unit installed on the source gas supply pipe and measuring an amount of source gas passing through the source gas supply pipe, and a temperature controller connected to the heater and the measuring unit. The temperature controller controls the heater based on the amount of the source gas measured by the measuring unit.

According to another exemplary embodiment of the present invention, a deposition apparatus includes a source gas supply unit supplying a source gas, a carrier gas supply supplying a carrier gas, and a deposition chamber receiving the source and carrier gases to perform a deposition process. The source gas supply unit includes a canister in which a source is stored, a heater heating the canister, a source gas supply pipe provided on one side of the canister, a measuring unit installed on the source gas supply pipe and measuring an amount of source gas passing through the source gas supply pipe, and a temperature controller connected to the heater and the measuring unit and controlling the heater based on the amount of the source gas measured by measuring unit.

According to still another exemplary embodiment of the present invention, a deposition method includes heating a canister using a heater to evaporate a source, measuring an amount of source gas supplied to an outside through a source gas supply pipe, and sending the measured value to a temperature controller, controlling the heater based on the measured amount of source gas using the temperature controller, and mixing the source gas with a carrier gas supplied from a carrier gas supply, and supplying the mixture gas into a deposition chamber.

Additional aspects and/or advantages of the invention will be set forth in part in the description which follows and, in part, will be obvious from the description, or may be learned by practice of the invention.

BRIEF DESCRIPTION OF THE DRAWINGS

These/and or other aspects and advantages of the invention will become apparent and more readily appreciated from the following description of the embodiments, taken in conjunction with the accompanying drawings of which.

DETAILED DESCRIPTION

Figure 1:
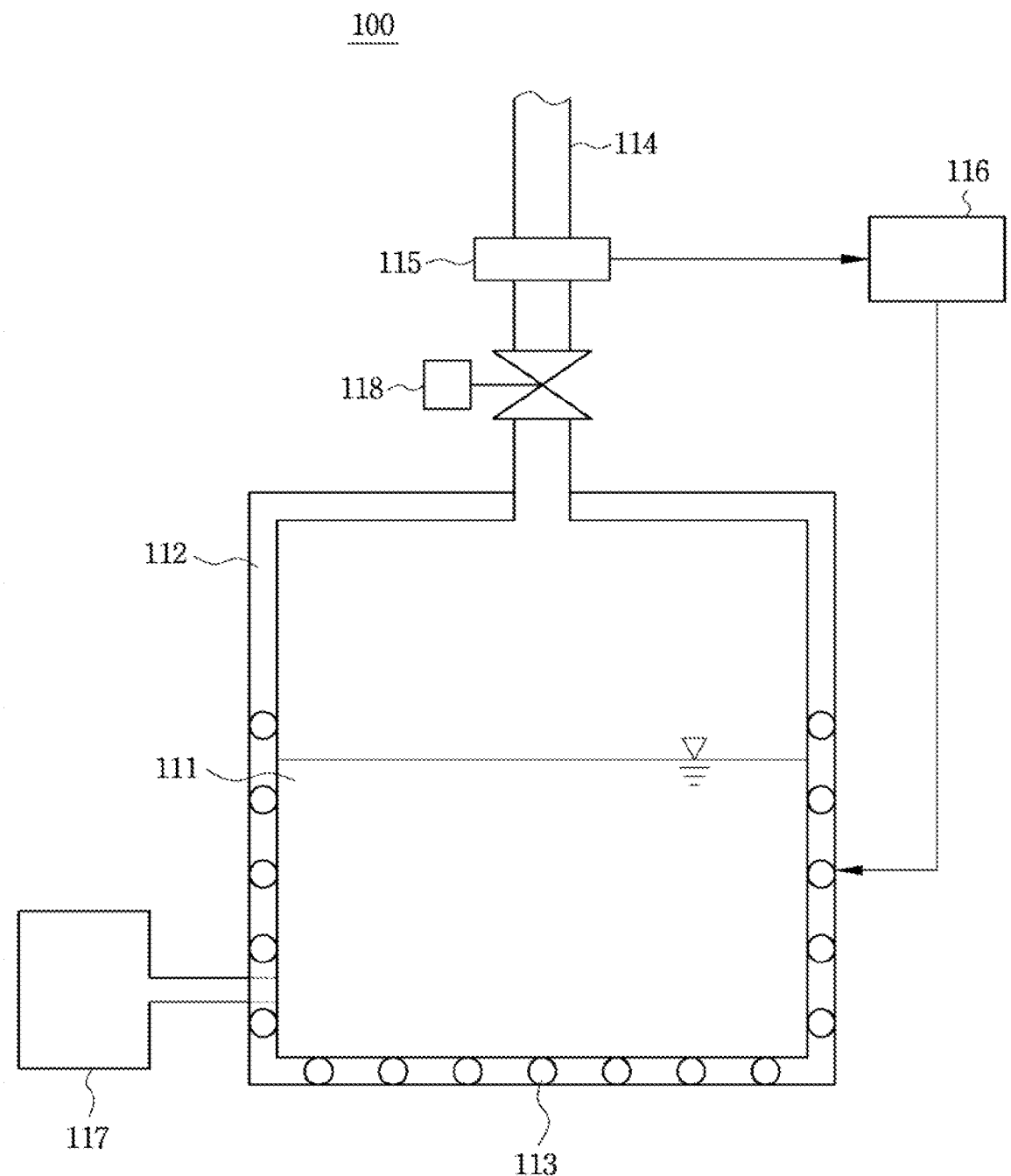
FIG. 1 illustrates a schematic configuration of a source gas supply unit according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 illustrates a schematic configuration of a source gas supply unit 100 according to an exemplary embodiment of the present invention. The source gas supply unit 100 includes a canister 112, a heater 113, a source gas supply pipe 114, a measuring unit 115, and a temperature controller 116. The canister 112 stores a source 111. The heater 113 heats the canister 112. The source gas supply pipe 114 is installed on one side of the canister 112. The measuring unit 115 is installed on the source gas supply pipe 114 and measures an amount of source gas passing through the source gas supply pipe 114. The temperature controller 116 is connected to the heater 113 and the measuring unit 115.

Further, the source gas supply unit 100 includes a source supply 117 connected with the canister 112 and supplying the source 111 into the canister 112, and a valve 118 opening or closing the source gas supply pipe 114. While described as part of the source gas supply unit 100, it is understood that the source supply 117 can be detachably connected to the source gas supply unit 100.

The source 111 is a substance for forming a layer through deposition. The source 111 generally exists in a liquid state, and is evaporated by heat supplied from the heater 113. The canister 112 stores the source 111. The canister 112 may have the shape of a hollow cylinder or a hollow hexahedron, but it does not limited to this shape. Further, the source 111 could also exist in a solid state prior to heating.

The heater 113 applies heat to the canister 112 in order to evaporate the source 111. The heater 113 may be integrally or detachably installed on the canister 112. Further, the heater 113 may be installed in the canister 112, or can be located outside the canister 112. However, it is preferable to install the heater 113 in the canister 112 for efficient heating. In addition, the heater 113 may be installed on the entire surface of the canister 112, and be selectively installed only on part of the canister 112, such as a lower surface or a lateral surface. The heater 113 may include a lamp heater or a coil heater, but the invention is not limited thereto.

The source gas supply pipe 114 is a passage for supplying the source gas evaporated by the heater 113 out of the canister 112. The source gas supply pipe 114 may be formed by extension of a part of the canister 112 or by connection of a separate pipe with the canister 112.

The measuring unit 115 measures an amount of the source gas passing through the source gas supply pipe 114. The measuring unit 115 is installed on source gas supply pipe 114, is connected with the temperature controller 116, and sends the measured amount of the source gas to the temperature controller 116. The measured amount can be the total amount detected in a time period, or can be a flow rate of the source gas passing through the source gas supply pipe 114.

The temperature controller 116 is connected with the heater 113 and the measuring unit 115, and controls the heater 113 on the basis of the amount of the source gas measured by the measuring unit 115. Specifically, when the amount of the source gas measured by the measuring unit 115 is less than a reference amount to be supplied, the temperature controller 116 controls the heater 113 to heat the canister 112 to a temperature higher than that set at present. In contrast, when the amount of the source gas measured by the measuring unit 115 is more than the reference amount to be supplied, the temperature controller 116 controls the heater 113 to heat the canister 112 to a temperature lower than that set at present. While not required, the temperature controller 116 can be implemented using a processor or computer implementing software and/or firmware encoded on a computer readable medium.

An operation of the source gas supply unit 100 according to an exemplary embodiment of the present invention as mentioned above will be described. When a deposition process is initiated, the heater 113 heats the canister 112, thereby evaporating the source 111. Here, the temperature controller 116 controls the heater 113 to heat the canister 112 to an initial set temperature.

At this time, since the valve 118 is in an open state, the evaporated source gas is supplied to the outside through the source gas supply pipe 114. Further, the source supply 117 supplies the source 111 into the canister 112 such that the source 111 stored in the canister 112 maintains a constant amount. The valve 118 can otherwise be in a closed state while the source gas is being initially heated or when the deposition process is not being performed.

The measuring unit 115 measures an amount of the source gas supplied to the outside through the source gas supply pipe 114, and then sends the measured value to the temperature controller 116. The temperature controller 116 controls the heater 113 according to the amount of the source gas measured by the measuring unit 115.

Specifically, when the amount of the source gas measured by the measuring unit 115 is less than a reference amount to be supplied, the temperature controller 116 controls the heater 113 to heat the canister 112 to a temperature higher than that set at present. In contrast, when the amount of the source gas measured by the measuring unit 115 is more than the reference amount to be supplied, the temperature controller 116 controls the heater 113 to heat the canister 112 to a temperature lower than that set at present. The amount of temperature increase or decrease can be determined experimentally according to the measured flow and stored as a table. Thus, with use of the source gas supply unit 100 according to an exemplary embodiment of the present invention, a carrier gas does not need to be supplied into the canister 112, and thus a shape or capacity of the source 111 is not affected by the carrier gas. As a result, the source 111 can be stably evaporated Further, the temperature of the heater 113 is controlled on the basis of the amount of the source gas supplied to the outside through the source gas supply pipe 114, so that the amount of the source gas supplied can be kept constant.

Further, since the measuring unit 115 measures only the amount of the source gas rather than the amount of a mixture gas of the source gas and the carrier gas, it is possible to more precisely measure the amount of the source gas, compared to measuring the amount of the mixture gas.

Figure 2:
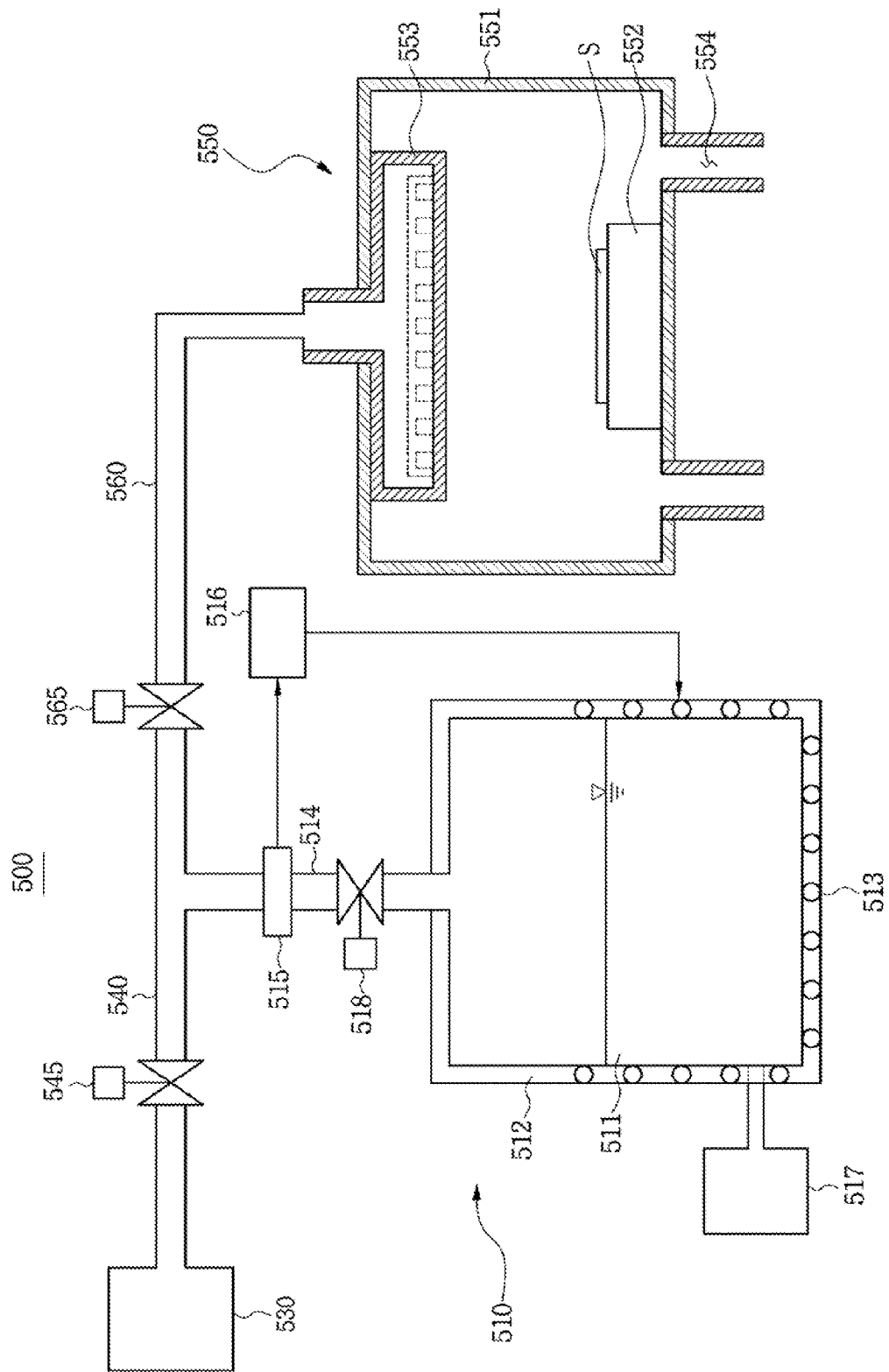
FIG. 2 illustrates a schematic configuration of a deposition apparatus according to an exemplary embodiment of the present invention.

FIG. 2 illustrates a schematic configuration of a deposition apparatus according to an exemplary embodiment of the present invention. Referring to FIG. 2, the deposition apparatus 500 such as a chemical vapor deposition (CVD) apparatus includes a source gas supply unit 510 supplying a source gas, a carrier gas supply 530 supplying a carrier gas, and a deposition chamber 550 receiving the source and carrier gases to perform a deposition process.

The source gas supply unit 510 is generally like the source gas supply unit 100 shown in FIG. 1, and so a detailed description thereof will be omitted. The source gas supply unit 510 includes a heater 513 that heats a canister 512, thereby evaporating a source 511. A temperature controller 516 controls the heater 513 to heat the canister 512. The evaporated source gas can be supplied to the outside through the source gas supply pipe 514. Further, a source supply 517 supplies the source 511 into the canister 512. A measuring unit 515 measures an amount of the source gas supplied to the outside through the source gas supply pipe 514, and then sends the measured value to the temperature controller 516. A valve 518 can be opened to allow the produced source gas to flow into the deposition chamber 550 during the deposition process, and can be in a closed state while the source gas is being initially heated or when the deposition process is not being performed The carrier gas supply 530 is connected with the source gas supply unit 510 through a first pipe 540 (i.e. a carrier gas supply pipe), and a source gas supply pipe 514. A first valve 545 for opening or closing the carrier gas supply pipe 540 is installed on the first pipe 540. However, it is understood that the first valve 545 need not be used in all aspects. The first valve 545 can be opened to allow the carrier gas to be supplied to the deposition chamber 550 during the deposition process, and can be closed when the deposition process is completed.

The deposition chamber 550 is connected with the source gas supply unit 510 through a second pipe 560 (i.e. a mixture gas supply pipe) and the source gas supply pipe 514. A second valve 565 for opening or closing the mixture gas supply pipe 560 is installed on the second pipe 560. However, it is understood that the second valve 565 need not be used in all aspects. The second valve 545 can be opened to allow the mixture of the source and carrier gases to be supplied to the deposition chamber 550 during the deposition process, and can be closed when the deposition process is completed.

The source gas supply pipe 514, first pipe 540, and second pipe 560 are interconnected at respective ends thereof. A joint where the source gas supply pipe 514, first pipe 540, and second pipe 560 are connected may have the shape of a venturi tube between the first pipe 540 and the second pipe 560. Thus, fluid passing through the joint speeds up as it enters the narrow throat of the joint, and the pressure drops. Thereby, the carrier gas supplied from the carrier gas supply 540 can be prevented from flowing into the source gas supply pipe 514. However, the invention is not limited thereto.

The deposition chamber 550 includes a chamber body 551, a susceptor 552, and a shower head 553. The chamber body 551 provides a space where a deposition process is carried out. The chamber body 551 may have the shape of a cylinder or a box, but it is not limited to this shape. The chamber body 551 is provided with a discharge port 554 in a lower portion thereof, which discharges a residual gas caused by the deposition process The chamber body 551 further includes a gate (not shown), which loads and unloads a substrate B. on one side thereof.

The susceptor 552 is located at an inner lower portion of the chamber body 551. The susceptor 552 allows the substrate S loaded into the chamber body 551 to be placed thereon, and supports the substrate S during the deposition process. The shower head 553 is installed at an inner upper portion of the chamber body 551 to be opposite to the susceptor 552. The shower head 553 is connected with the second pipe 560, and receives the mixture gas of the carrier gas and the source gas through the second pipe 560, and sprays a substance making up a source to uniformly deposit the substance on the substrate S.

An operation of the deposition apparatus 500 according to an exemplary embodiment of the present as mentioned above will be described. When a deposition process is initiated, the heater 512 heats the canister 512, thereby evaporating the source 511. Here, a temperature controller 516 controls the heater 513 to heat the canister 512 to an initial set temperature. At this time, the source gas supply unit 510 is in an open state, so that the evaporated source gas can be supplied to the outside through the source gas supply pipe 514.

Further, a source supply 517 supplies the source 511 into the canister 512 such that the source 511 stored in the canister 512 is maintained at a constant amount. The measuring unit 515 measures an amount of the source gas supplied to the outside through the source gas supply pipe 514, and then sends the measured value to the temperature controller 516. The temperature controller 516 controls the heater 513 on the basis of the amount of the source gas measured by the measuring unit 515.

In detail, when the amount of the source gas measured by the measuring unit 515 is less than a reference amount to be supplied, the temperature controller 516 controls the heater 513 to heat the canister 512 to a temperature higher than that set at present. In contrast, when the amount of the source gas measured by the measuring unit 515 is more than the reference amount to be supplied, the temperature controller 516 controls the heater 513 to heat the canister 512 to a temperature lower than that set at present.

Here, the first valve 545 and the second valve 565 are open such that the carrier gas and the mixture gas can flow therethrough.

The source gas supplied to the outside through the source gas supply pipe 514 is mixed with the carrier gas supplied through the first pipe 540, flows along the second pipe 560, and is supplied to the shower head 553 of the deposition chamber 550. The shower head 553 receives the mixture gas of the source and carrier gases, and sprays the substance making up the source on the substrate S placed on the susceptor 552 to be uniformly deposited.

As described above, with the use of the deposition apparatus according to an exemplary embodiment of the present invention, a constant amount of source gas is supplied into the chamber, so that a layer can be uniformly deposited.

According to the exemplary embodiments as described above, a carrier gas does not need to be supplied into a canister, and thus the shape or capacity of the source is not affected by the carrier gas. As a result, the source can be stably evaporated Further, the temperature of a heater is controlled on the basis of an amount of source gas supplied to the outside through a source gas supply pipe, so that the amount of the source gas supplied can be kept constant.

Further, since a measuring unit measures only the amount of the source gas rather than an amount of mixture gas of the source gas and the carrier gas, it is possible to more precisely measure the amount of the source gas, compared to measuring the amount of the mixture gas.

Further, since a uniform amount of source gas is supplied into a chamber body, it is possible to deposit a uniform layer.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A source gas supply unit comprising:
   a canister in which a source is stored in liquid form;
   a heater which heats the canister to produce a source gas from the source stored in the canister;
   a source gas supply pipe to receive the source gas from the canister;
   a measuring unit installed on the source gas supply pipe and which directly measures the flow rate of the source gas through the source gas supply pipe;
   a temperature controller which controls the heater based on the amount of the source gas measured by the measuring unit such that the pressure in the canister is sufficient to force the source gas into the source gas supply pipe without injecting a carrier gas into the canister; and
   a source supply connected to the canister and configured to maintain a substantially constant amount of the source in the canister.

2. The source gas supply unit according to claim 1, further comprising:
   a valve which selectively opens and closes the source gas supply pipe.

3. The source gas supply unit according to claim 1, wherein the heater is integrally installed on the canister.

4. The source gas supply unit according to claim 1, wherein the heater is installed on at least a portion of the canister.

5. The source gas supply unit according to claim 4, wherein the heater is installed on the entire surface of the canister.

6. The source gas supply unit according to claim 1, wherein the heater is installed on a lower and/or lateral surface of the canister.

7. The source gas supply unit according to claim 1, wherein the heater includes at least one of a lamp heater and a coil heater.

8. The source gas supply unit according to claim 1, wherein the source gas supply pipe extends from a part of the canister.

9. The source gas supply unit according to claim 1, wherein the heater is detachably connected to the canister.

10. A deposition apparatus comprising:
a source gas supply unit which supplies a source gas, the source gas supply unit comprising:
a canister in which a source is stored in liquid form,
a source supply connected with the canister and configured to maintain a substantially constant amount of the source in the canister,
a heater which heats the canister to produce a source gas from the source stored in the canister,
a source gas supply pipe to receive the source gas from the canister,
a measuring unit installed on the source gas supply pipe and which directly measures the flow rate of the source gas through the source gas supply pipe, and
a temperature controller which controls the heater based on the amount of the source gas measured by the measuring unit such that the pressure in the canister is sufficient to force the source gas into the source gas supply pipe without injecting a carrier gas into the canister;
a carrier gas supply which supplies a carrier gas; and
a deposition chamber which receives the supplied source and carrier gases to perform a deposition process.

11. The deposition apparatus according to claim 10, further comprising:
a first pipe which connects the carrier gas supply with the source gas supply unit and through which the carrier gas is supplied; and
a second pipe connecting the deposition chamber with the source gas supply unit and through which a mixture of the supplied carrier gas and the supplied source gas is supplied to the deposition chamber.

12. The deposition apparatus according to claim 11, wherein the first pipe connects the carrier gas supply with the source gas supply pipe of the source gas supply unit, and the second pipe connects the deposition chamber with the source gas supply pipe of the source gas supply unit.

13. The deposition apparatus according to claim 12, further comprising a joint which connects the first pipe, the source gas supply pipe, and the second pipe, the joint having a shape of a venturi tube to prevent the carrier gas from flowing into the source gas supply pipe.

14. The deposition apparatus according to claim 11, further comprising a first valve which selectively opens and closes the first pipe, and a second valve which selectively opens and closes the second pipe.

15. The deposition apparatus according to claim 11, wherein:
the deposition chamber includes:
a chamber body providing a space where a deposition process is carried out,
a susceptor disposed at an inner lower portion of the chamber body and which supports a substrate on which the source is deposited during the deposition process, and
a shower head disposed at an inner upper portion of the chamber body opposite to the susceptor, and which is connected to the second pipe so as to introduce the mixture of the supplied carrier gas and the supplied source gas into the chamber body.

16. The deposition apparatus according to claim 10, wherein the source gas supply
unit further includes:
a valve which selectively opens and closes the source gas supply pipe.

17. The deposition apparatus according to claim 10, wherein the heater is integrally installed on the canister.

18. The deposition apparatus according to claim 10, wherein the heater is installed on a part of the canister.

19. The deposition apparatus according to claim 18, wherein the heater is installed on the entire surface of the canister.

20. The deposition apparatus according to claim 10, wherein the heater is installed on a lower and/or lateral surface of the canister.

21. The deposition apparatus according to claim 10, wherein the heater includes at least one of a lamp heater and a coil heater.

22. The deposition apparatus according to claim 10, wherein the source gas supply pipe extends from a part of the canister.

23. The deposition apparatus according to claim 10, wherein the heater is detachably installed on the canister.

24. A source gas supply control system for use in a deposition processes performed in a deposition chamber, the control system comprising:
a canister to house a source in liquid form;
a heater disposed on the canister to heat the source to produce a source gas;
a source supply connected to the canister to maintain a substantially constant amount of the source in the canister;
a source gas supply pipe to receive the source gas from the canister;
a measuring unit installed on the source gas supply pipe and which directly measures the flow rate of the source gas produced by the heater and which will be mixed with a carrier gas for use in deposition of the source gas in the deposition chamber; and
a temperature controller which controls the heater based on the amount of the source gas measured by the measuring unit such that the pressure in the canister is sufficient to ensure a predetermined amount of the source gas is forced out of the canister without injecting a carrier gas into the canister.

25. The source gas supply control system according to claim 24, wherein:
if the measured amount is below a predetermined level, the temperature controller controls the heater to increase the heat heating the source, and
if the measured amount is above the predetermined level, the temperature controller controls the heater to decrease the heat heating the source.

* * * * *